(12) United States Patent
Kodim

(10) Patent No.: US 7,126,420 B2
(45) Date of Patent: Oct. 24, 2006

(54) R.F. OUTPUT POWER CONTROL

(75) Inventor: Walter Kodim, Nürnberg (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/507,752

(22) PCT Filed: Mar. 15, 2002

(86) PCT No.: PCT/EP02/02910

§ 371 (c)(1),
(2), (4) Date: Oct. 29, 2004

(87) PCT Pub. No.: WO03/079541

PCT Pub. Date: Sep. 25, 2003

(65) Prior Publication Data

US 2005/0140435 A1    Jun. 30, 2005

(51) Int. Cl.
*H03G 3/20* (2006.01)
(52) U.S. Cl. .................. 330/129; 330/110; 330/311
(58) Field of Classification Search ............... 330/129, 330/110, 311; 359/491, 483, 490, 492, 493, 359/502, 485, 589; 349/5, 105, 106
See application file for complete search history.

(56) References Cited

U.S. PATENT DOCUMENTS

| | | | |
|---|---|---|---|
| 4,378,530 A * | 3/1983 | Garde | 330/297 |
| 5,378,996 A | 1/1995 | Pai et al. | |
| 5,543,753 A * | 8/1996 | Williamson | 330/297 |
| 6,091,302 A | 7/2000 | Arevalo | |
| 6,351,189 B1 | 2/2002 | Hirvilampi | |
| 6,525,605 B1 * | 2/2003 | Hu et al. | 330/132 |
| 6,710,646 B1 * | 3/2004 | Kimball | 330/10 |
| 6,774,719 B1 * | 8/2004 | Wessel et al. | 330/136 |
| 6,859,097 B1 * | 2/2005 | Chandler | 330/107 |
| 6,914,480 B1 * | 7/2005 | Arai et al. | 330/126 |

FOREIGN PATENT DOCUMENTS

EP    0 829 954 A    3/1998

OTHER PUBLICATIONS

BINDRA; "Smart Biasing Keeps RF Power Amplifier on Track"; Electronic Design, Jan. 21, 2002, pp. 38 and 40.

* cited by examiner

*Primary Examiner*—Patricia Nguyen
(74) *Attorney, Agent, or Firm*—Nixon & Vanderhye P.C.

(57) ABSTRACT

An R.F. power amplifier circuit comprising a power control loop is described. The power control loop includes an R.F. power amplifier having a power control input and a power supply input as well as at least one feedback path coupled between the power control input and the power supply input of the power amplifier. The feedback path includes at least one variable loop element that has a control terminal configured to reduce variations of control loop parameters.

20 Claims, 9 Drawing Sheets

R.F. OUTPUT POWER CONTROL

This application is the U.S. national phase of international application PCT/EP02/02910, filed 15 Mar. 2002, which designated the U.S. The entire content of this application is incorporated herein by reference.

BACKGROUND OF THE INVENTION

1. Technical Field

The present invention relates to the field of radio frequency (R.F.) output power control and more particularly to an R.F. power amplifier circuit comprising a power control loop including an R.F. power amplifier. The invention further relates to a method of controlling the output power of the R.F. power amplifier.

2. Description of the Prior Art

Modern R.F. applications like wireless communications devices require an efficient R.F. output power control for example to ensure a high transmission quality and to keep output signal fluctuations within limits that are defined in various standards.

Typically, R.F. output power control involves a power control loop including the R.F. power amplifier, a detector device for detecting the output power of the R.F. power amplifier and an error amplifier. Such an R.F. power control loop is known for example from U.S. Pat. No. 5,378,996.

The power amplifier known from U.S. Pat. No. 5,378,996 has a control input, a signal input, an R.F. power output and a detector output. The detector signal at the detector output is provided by a detector device in the form of a detector diode coupled between the R.F. power output and the detector output of the power amplifier. The detector output is coupled to a negative input of the error amplifier and an output of the error amplifier is connected to the control input of the power amplifier. Thus the power amplifier, the detector and the error amplifier form a power control loop with negative feedback. The error amplifier also has a positive input to which a reference signal is applied.

The R.F. output power control described in U.S. Pat. No. 5,378,996 is based on the measurement of the R.F. output power. However, in principle R.F. output power control could also be based on a measurement of the R.F. power amplifier current, i.e. on the power or current consumption of the R.F. power amplifier.

R.F. output power control based on a measurement of the R.F. power amplifier current is described in Ashok Bindra, "Smart biasing keeps R.F. power amplifier on track", electronic design, 21 Jan. 2002, pp. 38, 40. In this article a monolithic controller that regulates and controls the output power of an R.F. power amplifier is described.

The controller is part of a closed loop solution that permits calibration of the R.F. power amplifier's gate biasing voltage in real-time modes. A schematic block diagram of an R.F. power amplifier circuit comprising the known controller is depicted in FIG. 1a. As becomes apparent from FIG. 1a, the R.F. power amplifier circuit 10 comprises a power control loop 12 and a signal supply branch 14. The power control loop 12 comprises an R.F. power amplifier 22, a current sensing element in the form of a resistor 24, a detector in the form of a comparator 16 and a filter 18.

The resistor 24 is used to sense the drain current of the R.F. power amplifier 22. The drain current is converted into a voltage that is fed together with an external voltage reference from the signal supply branch 14 to the comparator 16.

The output signal of the comparator 16 is filtered by the filter 18 and the filtered signal is used to control the R.F. power amplifier's 22 gate biasing voltage.

To cope with temperature drift and aging that affect efficiency and linearization of the R.F. power amplifier 22, a control input 14' is provided outside the power control loop 12 between the signal supply branch 14 and the comparator 16. By means of a control signal applied to the control input 14' the output power $P_{OUT}$ of the power amplifier 22 can be controlled.

Departing from an R.F. output power control scheme taking into account the R.F. power amplifier current, there is a need for a R.F. power amplifier circuit which allows a robust implementation of a power control scheme. There is also a need for a method of controlling the R.F. power amplifier of such an R.F. power amplifier circuit.

SUMMARY OF THE INVENTION

According to the present invention an R.F. power amplifier circuit is provided which comprises a power control loop including an R.F. power amplifier having a power control input and a power supply input, and at least one variable loop element coupled between the power control input and the power supply input of the power amplifier, the at least one variable loop element having a control input configured to reduce variations of control loop parameters.

The control input of the variable loop element thus enables to actually control the control loop by taking into account a feedback signal characteristic of a current consumption of the power amplifier. This control of the control loop preferably aims at indirectly controlling the output power by attaining a stationary state, whereas prior art solutions aim at changing such a stationary state. The variable loop element may be an element that can be tuned continuously or stepwise. The characteristics of the variable loop element arranged in the feedback path may be controlled such that variations of dynamic loop parameters like the loop damping factor or the natural loop frequency are reduced and, ideally, completely compensated.

It is thus firstly proposed to base the output power control on a feedback signal characteristic of the power amplifier current and secondly to reduce loop parameter variations, many of which are specific to such a feedback mechanism, by providing one or more variable loop elements in the feedback path. The variable loop elements may be actively or passively controlled for example such that the control loop parameters become linearized or stationary.

Reduced control loop parameter variations lead to an output power control which is more robust. Furthermore, calibration time required e.g. for power-time-template calibration can be reduced especially in the case of power amplifier circuits that are to be operated in multiple frequency bands.

The variable loop element may be controlled directly or after signal conversion by a signal readily available at the power amplifier circuit and preferably by a signal related to the output power control like an externally provided reference power control signal fed to the power control loop or a power control signal created within the power control loop. Additionally or alternatively, the variable loop element may be controlled by a dedicated control signal like an offset signal. Preferably, the variable loop element is configured such that it is simultaneously controlled by a readily available signal related to the output power control and a signal related to the output power control and a dedicated control signal.

The variable loop element has a control input to which a dedicated control signal and/or a readily available but, if required, additionally processed control signal may be fed. This control input allows for example to tune the variable loop element continuously or discretely. In particular, the control input allows to create a further (internal) feedback path (i.e. an internal control loop for the variable loop element) by coupling the control input for example to a particular node of the (external) feedback path between the power control input and the power supply input of the power amplifier. Alternatively, the internal feedback path may be created by coupling the control input of the variable loop element to a node outside the external feedback path. For example the control input may be coupled to a signal supply branch of the power control loop. By means of the internal control loop a feedback signal tapped from the power control loop or the signal supply branch may thus be fed directly or after signal conversion to the control input of the variable loop element.

The control input of the variable loop element may be coupled to a signal converter which may be arranged in the internal feed back path and which may comprise at least one of a filter circuit, a multiplier, a level shifter, a buffer, a limiter, a look-up table and a voltage or current source. Preferably, the signal converter converts a converter input signal into a converter output signal that is coupled via the control input to the variable loop element.

The converter input signal is preferably a readily available power control signal or a signal derived therefrom. The signal converter may have his own control terminal to which for example the power control signal or the signal derived therefrom is fed. Alternatively, such a signal may be coupled directly to the control input of the variable loop element. A digital control interface may be coupled either to the control terminal of the signal converter or directly to the control input of the variable loop element. The digita control interface is preferably arranged in the internal feed back path.

In a preferred embodiment the power amplifier is operable in multiple frequency bands. In such a case the variable loop element may be controlled in each frequency band differently. Such an individual control is preferably performed such that identical loop parameters for all frequency bands are achieved. To that end, frequency band specific control signals may be fed to the variable loop control element. Identical loop parameters for all frequency bands allow to expedite calibration since calibration values found for one frequency band can be used (in conjunction with the appropriate control signal) for the remaining frequency bands as well.

Variations of control loop parameters are caused by a plurality of mechanisms. In the case the output power control is based on a feedback signal characteristic of the power amplifier current, variations of the power amplifier constant are a major contribution to loop parameter variations. The power amplifier constant describes the relationship between current consumption and control voltage of the power amplifier.

It is advantageous if the characteristic of the variable loop element is selected to vary and/or is varied in such a manner that the adverse effects of variations of the power amplifier constant are reduced. Of course, the characteristic of the variable loop element may also vary or be varied such that additional effects or other effects that cause loop parameter variations are reduced.

The variable loop element may be a dedicated component arranged in the feedback path solely for the purpose of reducing loop parameter variations. Additionally or alternatively, a component already present in the feed path, for example a filter, a sensing element or a detector, may be configured such that the component allows in addition to its primary task a deliberate reduction of loop parameter variations.

Preferably, the variable loop element is constituted by a variable filter like a loop filter or a low pass filter of the power control loop. The variable filter may comprise at least one of a variable resistor and a variable capacitance. Furthermore, in the case of an active filter a dedicated control routine may be implemented which allows to reduce loop parameter variations.

The variable loop element may be constituted by or may comprise a varicap diode. Such a varicap diode provides a variable capacitance which is controlled by the voltage across the anode terminal and the cathode terminal. Thus the varicap diode may be controlled by the loop control signal and more particularly by the loop control voltage. An additional control signal may be applied to either one or both of the two terminals of the varicap diode to introduce a further control parameter.

If used in a filter arrangement, the varicap diode renders the filter variable. However, the varicap diode may also be used in conjunction with other variable loop elements like a loop detector. Instead of or in addition to a varicap diode, the loop detector may have a variable gain which is controlled such that loop parameter variations are reduced.

The invention described above may be implemented as a hardware solution or as a software solution. In the case of a software solution the invention may be realized in the form of a computer program product comprising program code portion for performing the steps of the invention. This computer program product may be stored on a computer readable recording medium.

According to a preferred embodiment of the invention, the R.F. power amplifier circuit of the invention is arranged in a network component like a mobile terminal for wireless communications (for example a multi-band mobile telephone) or a driver stage of a base station of a mobile communications network.

BRIEF DESCRIPTION OF THE DRAWINGS

Further aspects and advantages of the invention will become apparent upon reading the following detailed description of preferred embodiments of the invention and upon reference to the drawings, in which.

DESCRIPTION OF PREFERRED EMBODIMENTS

In the following the invention is exemplarily set forth with respect to an R.F. power amplifier circuit comprising a variable loop element in the form of a variable loop filter. It should be noted however that in principle any other element of the power control loop could be modified such that it functions as a variable loop element in addition to or instead of the variable loop filter. Moreover, although the invention is exemplarily explained in conjunction with a variable loop capacitor, other variable components like variable resistors and other variable parameters like a variable detector gain may be used also to implement a variable loop element.

Furthermore, the following discussion of the preferred embodiments does not take temperature drift of the variable capacitors or requirements for properly biasing the variable capacitors into consideration. In practical realizations, appropriate means to compensate for the temperature drift and means to properly bias the variable capacitors will have to be provided.

Figure 1A:
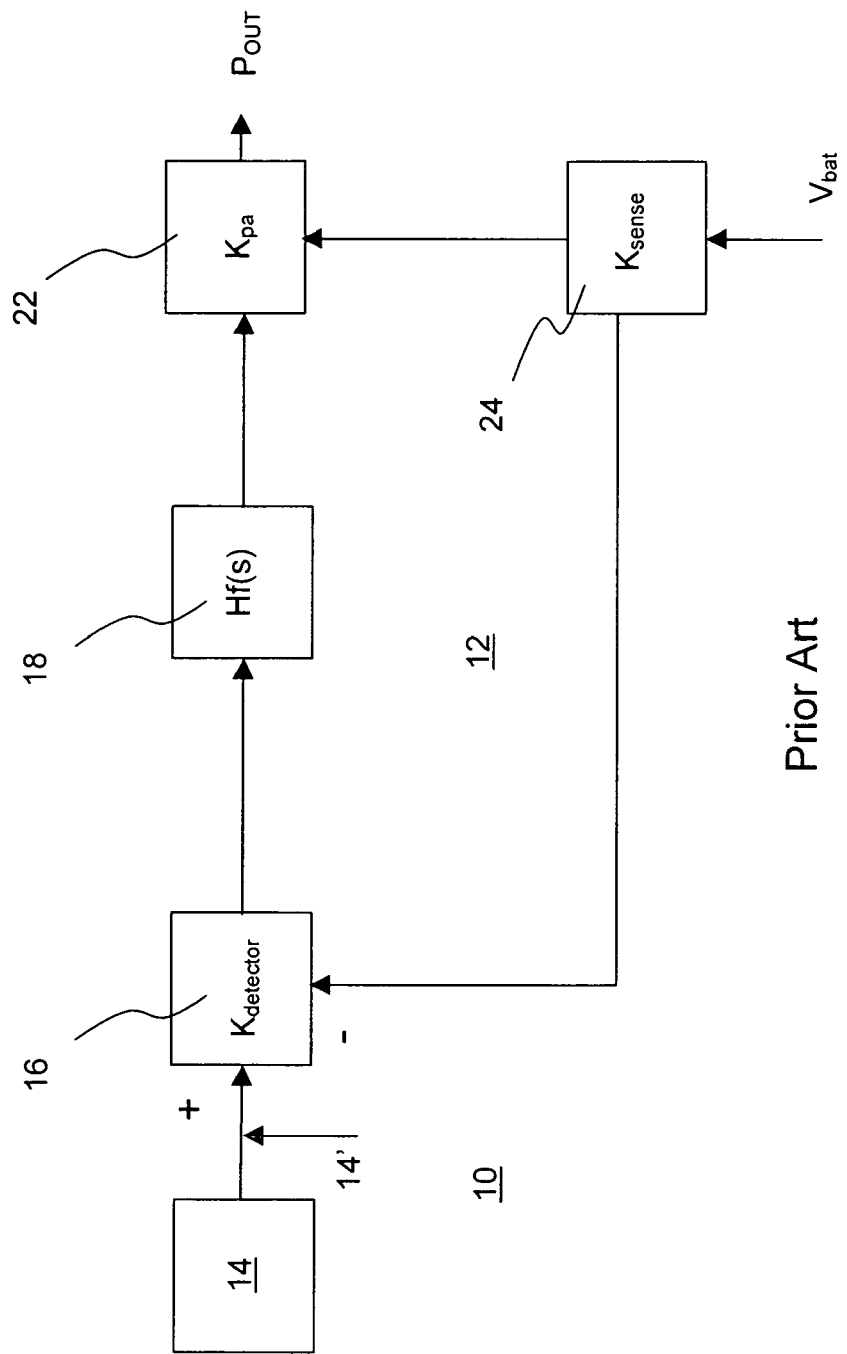
FIG. 1a is a block diagram of a prior art R.F. power amplifier circuit.
Figure 1B:
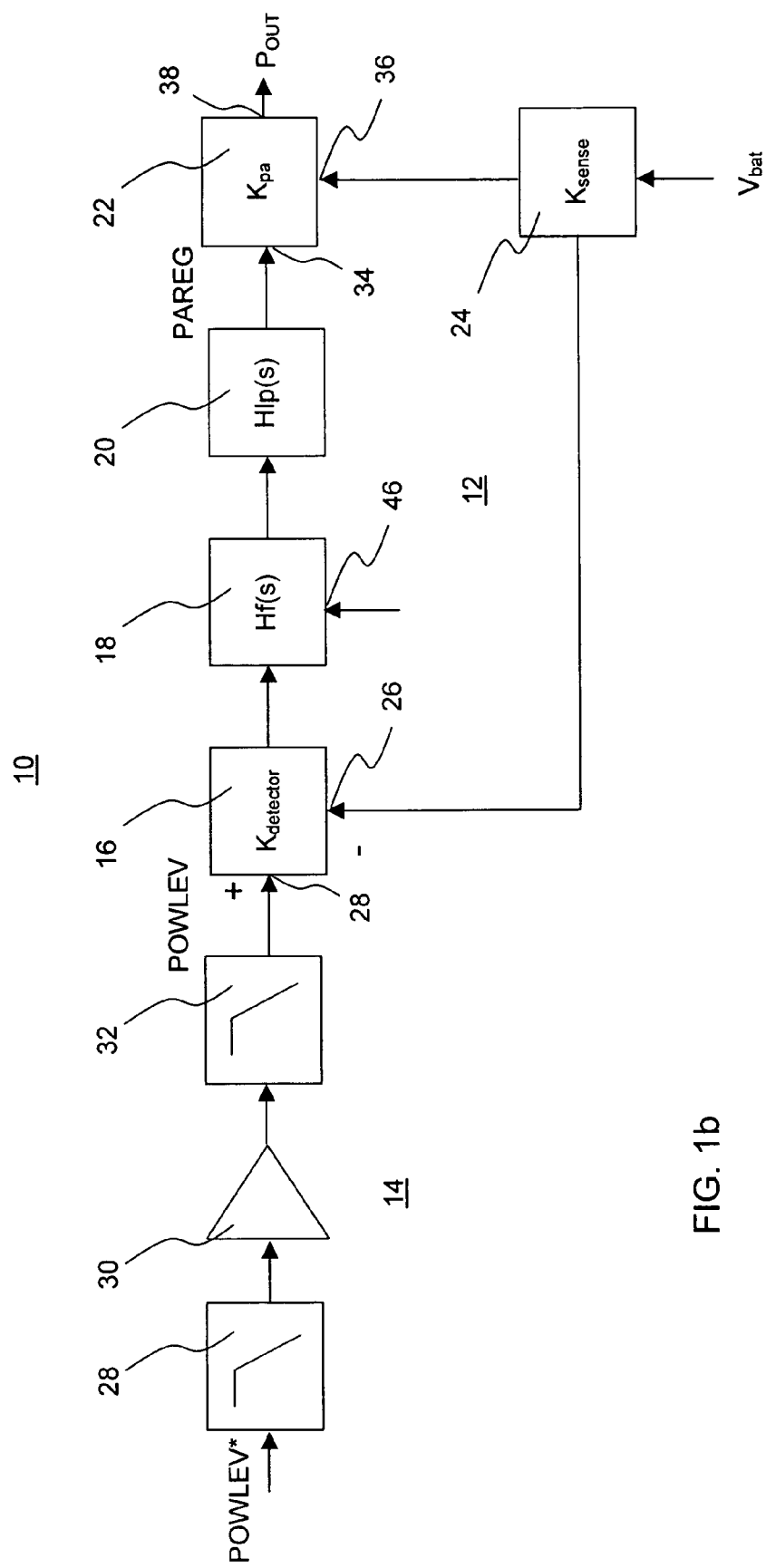
FIG. 1b is a block diagram of an R.F. power amplifier circuit according to the invention.

In FIG. 1b block diagram of an exemplary R.F. power amplifier circuit 10 according to the invention is shown. The power amplifier circuit 10 includes a power control loop 12 and a reference voltage supply branch 14 coupled to the power control loop 12.

The power control loop 12 comprises a detector circuit 16, a loop filter 18, an optional low pass filter 20, a power amplifier 22 and a current sensing element 24. In the exemplary embodiment described with reference to FIG. 1b, the detector circuit 16 comprises an error amplifier having a negative input 26 and a positive input 28. The positive input 28 is coupled to the reference voltage supply branch 14 which includes a first pulse shaping filter 32 in communication with the positive input 28 of the detector circuit 16, an exponential amplifier 30 having an output coupled to the first pulse shaping filter 32, and a second pulse shaping filter 28 coupled to the input of the exponential amplifier 30.

An output of the detector circuit 16 is coupled to the loop filter 18 which has a control input 46 configured to reduce loop parameter variations. The loop filer 18 is coupled via the low pass filter 20 to a power control input 34 of the power amplifier 22. The power amplifier 22 further has a power supply input 36, an R.F. power output 38 and an R.F. signal input not shown in FIG. 1b. The current sensing element 24 is constituted by a resistor that is coupled between the power supply input 36 of the power amplifier 22 and a current supply ($V_{bat}$).

The basic operation of the power amplifier circuit 10 depicted in FIG. 1b is as follows.

A discrete control voltage POWLEV* fed into the second pulse shaping filter 28 is converted in the reference voltage supply branch 14 into a continuous power amplifier reference voltage POWLEV that is applied to the positive input 28 of the detector circuit 16. In the detector circuit 16 this power amplifier reference voltage POWLEV is compared with a feedback signal generated by the current sensing element 24. The difference signal is amplified by the detector circuit 16 and fed in the form of a power amplifier control voltage PAREG via the loop filter 18 and the low pass filter 20 to the power control input 34 of the power amplifier 22. The power amplifier 22 amplifies an R.F. input signal in accordance with the power amplifier control voltage PAREG and outputs the amplified signal via its power output 38.

As can be seen from FIG. 1b, the power control loop 12 comprises a feedback path coupled between the power control input 34 and the power supply input 36 of the power amplifier 22. This feedback path comprises the current sensing element 24, the detector circuit 16, the loop filter 18 and the low pass filter 20.

By coupling the feedback path to the power supply input 36 of the power amplifier 22, the output power control of the power amplifier 22 is based on a feedback signal characteristic of the current consumption of the power amplifier 22. As a result of the fact that output power control is based on a feedback signal characteristic of the current consumption of the power amplifier 22, the power amplifier constant $K_{pa}$, which describes the relationship between current consumption and control voltage PAREG of the power amplifier 22, influences the dynamic parameters of the power control loop 12. This becomes apparent from the transfer function H(s) of the power control loop 12, which can be written $$H(s) = \frac{Hf(s) \cdot Hlp(s) \cdot Kdetector \cdot Kpa \cdot Ksense}{1 + Hf(s) \cdot Hlp(s) \cdot Kdetector \cdot Kpa \cdot Ksense}, \quad (1)$$

where the transfer function Hf(s) of the loop filter 18 can exemplarily be written as $$Hf(s) = \frac{1}{sCc}, \quad (2)$$

the transfer function Hlp(s) of the low pass filter 20 can be written as $$Hlp(s) = \frac{1}{1 + s \cdot R_{lp} \cdot C_{lp}}, \quad (3)$$

the transfer function $K_{sense}$ of the current sensing element 24 can be written as $$K_{sense} = R_{sense'} \quad (4)$$

and the transfer function $K_{detector}$ of the detector circuit 16 can be written as $$K_{detector} = G_m \qquad (5)$$

In the following, two specific control loop parameters, namely the loop damping factor d and the natural loop frequency $w_n$, of the power control loop 12 will exemplarily be considered in more detail. These control loop parameters can be written as $$d = \frac{1}{2} \cdot \sqrt{\frac{C_c}{C_{lp} \cdot R_{lp} \cdot K_{pa} \cdot R_{sense} \cdot G_m}} \qquad (6)$$

and $$wn = \sqrt{\frac{R_{sense} \cdot K_{pa} \cdot G_m}{C_{lp} \cdot R_{lp} \cdot C_c}} \qquad (7)$$

From equations (6) and (7) it is obvious that dynamic properties like the loop damping factor d and the loop bandwidth of the power control loop 12 strongly depend on variations of the power amplifier constant $K_{pa}$. The power amplifier constant $K_{pa}$, however, strongly varies with the power amplifier control voltage PAREG. This becomes apparent from FIG. 2 that shows a diagram depicting the functional relationship between the power amplifier constant $K_{pa}$ and the power amplifier control voltage PAREG as derived on the basis of a power amplifier model.

It has been experimentally found that the power amplifier constant $K_{pa}$ of a typical power amplifier for the 900 MHz band of the Global System for Mobile communications (GSM 900) varies between 1.6 A/V and 0.96 A/V, that the power amplifier constant $K_{pa}$ of a typical triple band GSM 900/GSM1800/GSM1900 power amplifier ranges between 3 A/V and 0.2 A/V, and that a dual band power amplifier has a maximum power amplifier constant $K_{pa}$ which can be as high as 6 A/V.

As becomes apparent from the above, the relationship between the power amplifier control voltage PAREG and the power amplifier constant $K_{pa}$ is highly non-linear. Consequently, typical dynamic control loop parameters like the loop damping factor d and the natural loop frequency $w_n$ strongly vary with the power amplifier control voltage PAREG.

Such variations of the control loop parameters render power control loop design very difficult. Power control loop design has to ensure that on the one hand the loop bandwidth is wider than the bandwidth of the pulse shaping filters 28, 32 to ensure that pulse shaping remains independent of power control loop parameters. On the other hand the loop bandwidth shall be as small as possible (with constant damping factor) in order to reduce noise. Furthermore, constant control loop parameters are advantageous from a calibration point of view. Power control loop design aims at finding a compromise on all aspects discussed above. This requires, however, that variations of the control loop parameters are reduced as strong as possible.

According to the exemplary embodiment of the invention discussed in context with FIG. 1b, a variable loop element with a control input is provided which reduces the loop parameter variations that result from variations of the power amplifier constant $K_{pa}$. Of course, variations of additional parameters or of other parameters apart from the power amplifier constant $K_{pa}$ could also be compensated in accordance with the invention to linearize the control loop parameters.

In principle, variations of the power amplifier constant $K_{pa}$ in equations (6) and (7) could be compensated by rendering one or more of the other parameters of equations (6) and (7) variable and be varying these one or more other parameters appropriately. This means that basically a variable loop element in the form of a variable current sensing element 24, a variable detector circuit 16, a variable loop filter 18 and/or a variable low pass filter 20 could be provided. Additionally or alternatively, a dedicated variable loop element could be introduced into the power control loop 12.

As becomes apparent from equations (6) and (7), the capacitance $C_c$ of the loop filter 18 and the gain $G_m$ of the detector circuit 16 are parameters that can especially advantageously be used for compensating variations of control loop parameters that are induced by a varying power amplifier constant $K_{pa}$. In the following, linearization of the power control loop 12 is exemplarily illustrated in conjunction with a variable capacitance $C_c$.

Figure 2:
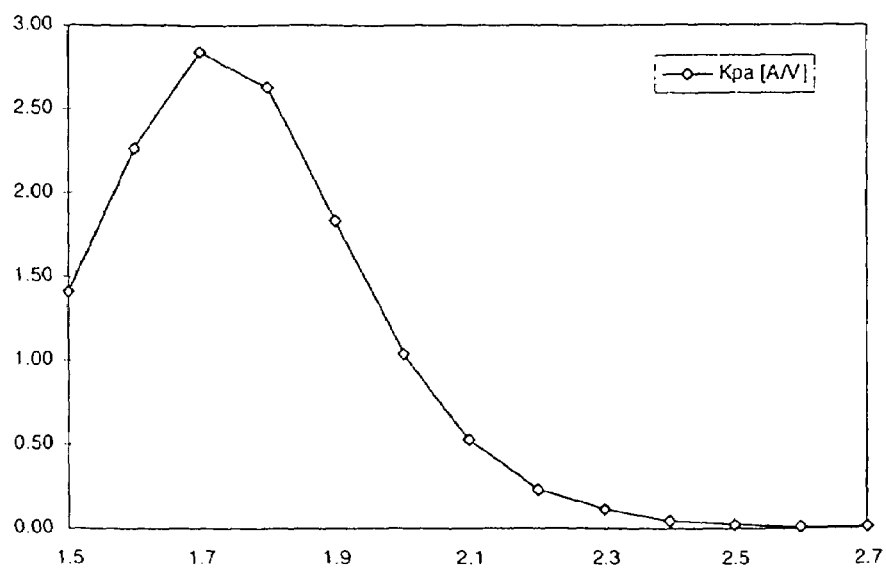
FIG. 2 is a diagram depicting the relationship between the power amplifier constant and the power amplifier control voltage.

Departing from the relationship between the power amplifier constant $K_{pa}$ and the control voltage PAREG depicted in FIG. 2 on the one hand and typical values for the individual parameters of equations (6) and (7) on the other hand, the damping factor d and the natural loop frequency $w_n$ can vary as illustrated in the following table:

| | | |
|---|---|---|
| Gm | 0.008 S | 0.008 S |
| Cc | 100 pF | 100 pF |
| Rlp | 56 Ω | 56 Ω |
| Clp | 1 nF | 1 nF |
| Rsense | 0.05 Ω | 0.05 Ω |
| Kpa | 2.84 A/V (PAREG = 1.7 V) | 0.03 A/V (PAREG = 2.5 V) |
| d | 2.0 | 22.3 |
| wn | 4.501 × 10⁶ rad/s | 4.401 × 10⁶ rad |

The above variation of the damping factor d and of the natural loop frequency $w_n$ is made less dependent on the variation of the power amplifier constant $K_{pa}$ by introducing a variable loop filter having a variable capacitance $C_c$ that can be varied at the same rate as the variation of $K_{pa}$. However, prior to discussing realization of variable loop filters, possible implementations of (static) realizations are considered with reference to FIGS. 3 and 4.

Figure 3:
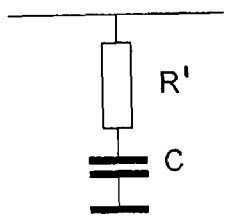
FIG. 3 shows a first implementation of a static loop filter.

According to a first variant, the detector circuit is realized in the form of an amplifier as part of a mixed signal ASIC, whereas the passive loop filter is created with a discrete capacitor C and a discrete resistor R' which form a PI loop filter as depicted in FIG. 3. As becomes apparent from FIG. 3, the discrete capacitor C is connected single sided to ground.

The transfer function Hf(s) of the loop filter depicted in FIG. 3 can be written as follows:

$$Hf(s) = \frac{1 + sR'C}{sC} \qquad (8)$$

Equation (8) basically corresponds to equation (2) and equations (6) and (7) could be rewritten accordingly.

Figure 4:
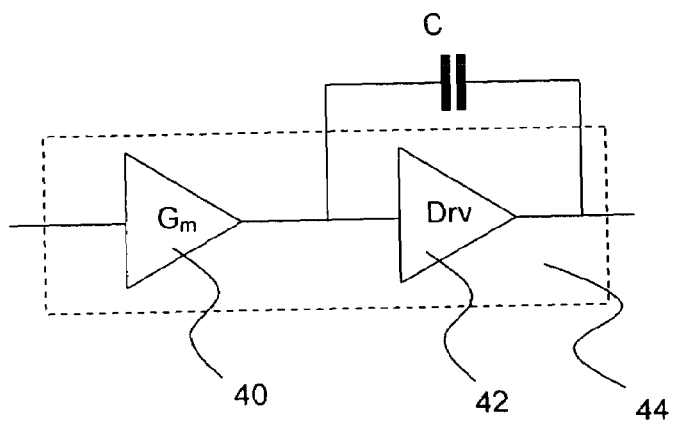
FIG. 4 shows a second implementation of a static loop filter.

According to a second variant, the detector circuit and the loop filter might be realized as depicted in FIG. 4, i.e. with an amplifier stage 40 and a driver stage 42. The amplifier stage 40 and the driver stage 42 are both part of a mixed signal ASIC, whereas loop filter capacitor C remains a discrete component. The transfer function F(s) of the combined amplifier stage 40 and driver stage 42 depicted in FIG. 4 can be written as $$Hf(s) = G_m \times \frac{1}{sC} \quad (9)$$

The implementation depicted in FIG. 4 is advantageous because compared to the implementation depicted in FIG. 3 there is no external resistor required for the loop filter.

Figure 5A:
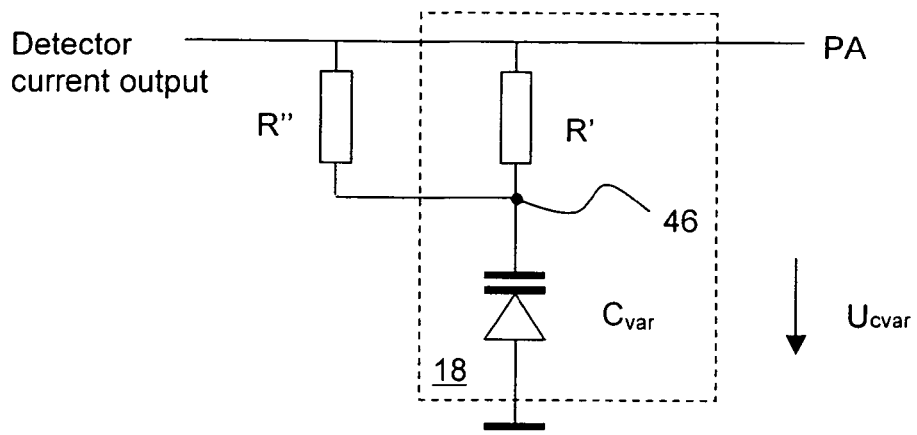
FIGS. 5a and 5b schematically show a first embodiment in accordance with the invention of a variable loop element in the form of a variable loop filter.

In FIG. 5a a first variant of a variable loop filter 18 according to the invention is depicted. As becomes apparent from FIG. 5a, the variable loop filter 18 comprises a resistor R' and a variable loop capacitor $C_{var}$ in the form of a varicap diode. The loop capacitor $C_{var}$ depicted in FIG. 5a is the equivalent of loop capacitor C depicted in FIG. 3, but the capacitance of loop capacitor $C_{var}$ is variable and basically controlled by the power amplifier control voltage PAREG, i.e. changes approximately at the same rate as the power amplifier constant $K_{pa}$ varies.

The variable loop filter 18 has a control input 46 that is coupled between a cathode of the variable loop capacitor $C_{var}$ on the one hand and a common node to which the resistor R' is coupled on the other hand. An external resistor R" is also coupled to this common node and provides a control signal from the detector 16 to the control input 46 of the variable loop filter 18. Thus an internal control loop including the variable loop capacitor $C_{var}$ is formed. An internal control signal of the control loop 12 is tapped via the resistor R" and fed to the control input 46 coupled to the variable loop capacitor $C_{var}$.

In principle, the two parallel resistors R', R" depicted in FIG. 5a could be combined to a single resistor R. A corresponding equivalent circuit of the variable loop filter 18 of FIG. 5a is depicted in FIG. 5b.

Figure 5B:
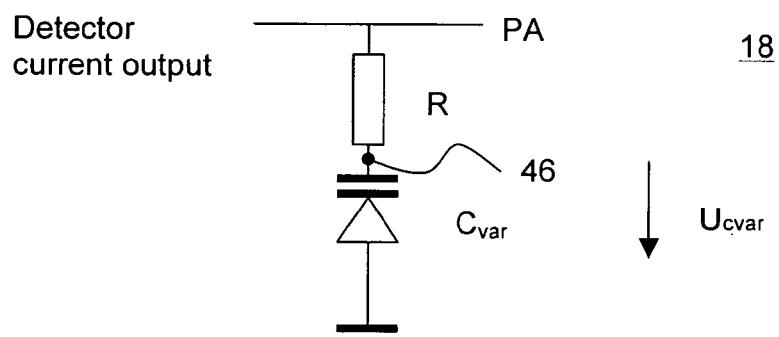

The loop filter 18 depicted in FIGS. 5a and 5b constitutes a passive PI loop filter with variable "I" part due to the variable capacitor $C_{var}$. The transfer function Hf(s) of the loop filter 18 becomes a function of the voltage $U_{cvar}$ across the terminals of $C_{var}$. This allows to reduce variations of control loop parameters that are caused by variations of the power amplifier constant $K_{pa}$.

Figure 6:
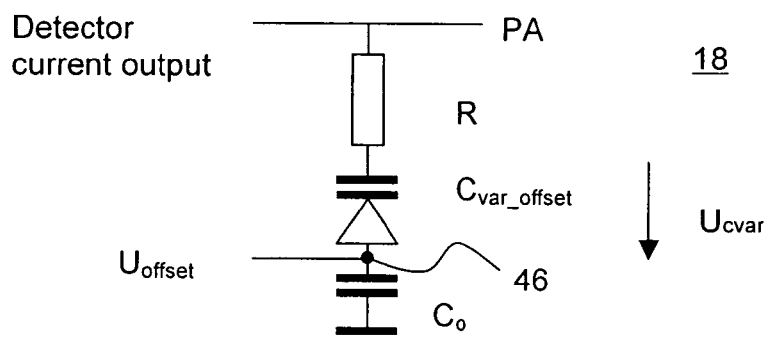
FIG. 6 schematically shows a second embodiment in accordance with the invention of a variable loop element in the form of a variable loop filter.

FIG. 6 shows the same PI loop filter configuration as depicted in FIGS. 5a and 5b but with an (additional) control terminal 46 for the loop capacitor $C_{var}$ that is coupled between an anode of the loop capacitor $C_{var}$ and an additional capacitor $C_o$ which provides a dc block to ground. A control signal in the form of a control voltage $U_{offset}$ may be applied to the control input 46 of the variable loop filter 18. In the presence of $U_{offset}$ the value of $C_{var\_offset}$ is determined by the difference between the power amplifier control voltage PAREG and the control voltage $U_{offset}$. The control voltage $U_{offset}$ thus allows to tune the loop capacitor $C_{var}$ in order to even better reduce variations of control loop parameters.

The transfer function Hf(s) of the loop filter 18 depicted in FIG. 6, which is a function of the voltage difference $U_{cvar}$ between the power amplifier control voltage PAREG and the control voltage $U_{offset}$, can be written as $$Hf(s, Uc \text{ var}) = \frac{1 + sRCi}{sCi}$$

with $$Ci(uc \text{ var}) = \frac{Co * C \text{ var\_offset}(Uc \text{ var})}{Co + C \text{ var\_offset}(Uc \text{ var})}$$

As a result of the control voltage $U_{offest}$ applied to the control input 46 of the variable loop filter 18, the $C_{var\_offset}$ versus power amplifier control voltage PAREG curve is shifted along the x-axis. Such a tuning is extremely useful for matching the characteristics of $C_{var\_offset}$ to the characteristics of the power amplifier constant $K_{pa}$.

Figure 7:
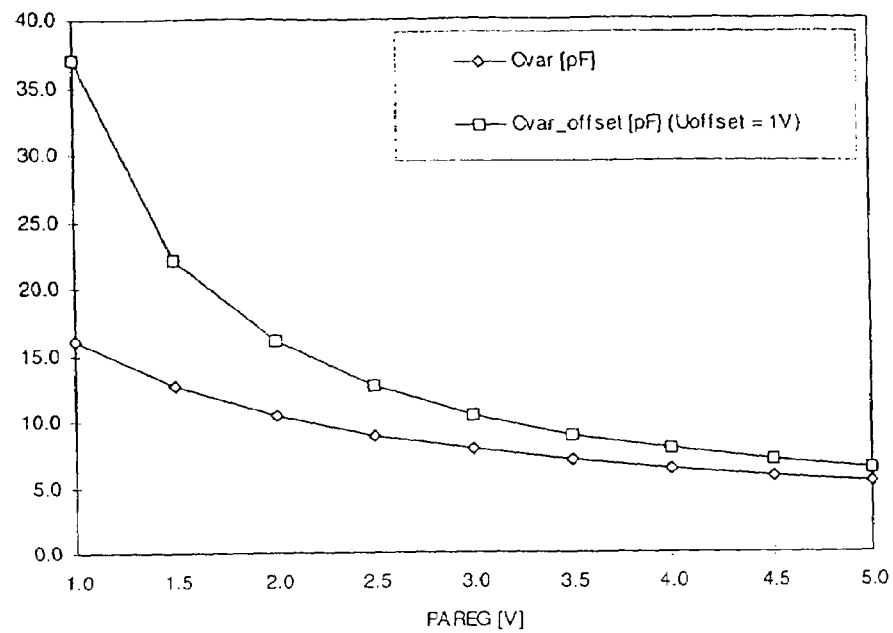
FIG. 7 shows the relationships between the power amplifier control voltage and the variable capacitances of the two embodiments depicted in FIGS. 5 and 6.

The characteristics of the $C_{var}$ and $C_{var\_offset}$ are depicted in FIG. 7. As becomes apparent from FIG. 7, $C_{var\_offset}$ is the shifted replica of $C_{var}$.

Figure 8:
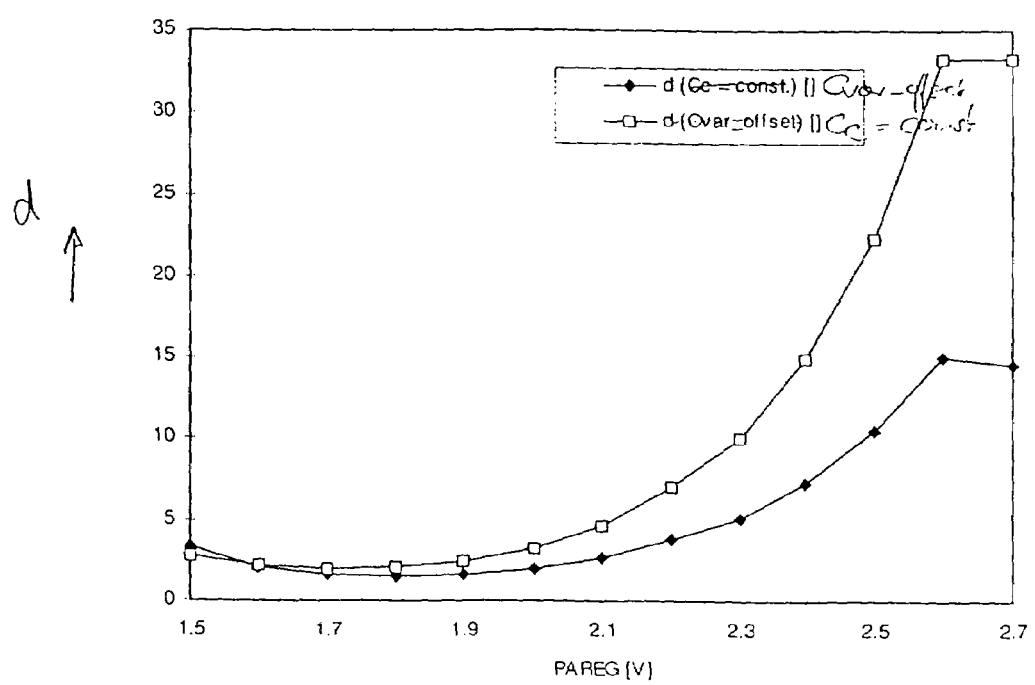
FIG. 8 shows the variation of the damping factor in dependence of the power amplifier control voltage for a prior art loop filter capacitor and a variable loop filter capacitor according to the invention.

In FIG. 8 a comparison of the damping factors d for a loop filter having a fixed capacitance C and a variable loop filter 18 as depicted in FIG. 6 having a tuned and variable loop filter capacity $C_{var\_offset}$ is shown. The use of the variable loop filter 18 allows to reduce the variation of the damping factor d by approximately a factor of 2. This also becomes apparent from the table below.

|  | Cc = Cvar_offset | Cc = const |
|---|---|---|
| Kpa | 2.84 A/V (PAREG = 1.7 V) | |
| D | 1.6 | 2.0 |
| Wn | 5.601 × 10$^6$ rad/s | 4.501 × 10$^6$ rad/s |
| Kpa | 0.03 A/V (PAREG = 2.5 V) | |
| D | 10.5 | 22.3 |
| Wn | 0.852 × 10$^6$ rad/s | 0.401 × 10$^6$ rad/s |
| d_ratio | 6.6 | 11.2 |
| wn_ratio | 0.152 | 0.089 |

Further approvements can be achieved by using a varicap diode with a capacitance characteristic that better matches the characteristic of the power amplifier constant $K_{pa}$ and by actively controlling the control voltage $U_{offset}$.

Since the power amplifier constant $K_{pa}$ also varies with frequency, the characteristics of the power amplifier constant $K_{pa}$ will be different for different frequency bands. The control voltage $U_{offset}$ can thus be used to tune $C_{var\_offset}$ for each frequency band individually to achieve identical control loop parameters for all frequency bands. In the case of identical control loop parameters power-time-template calibration for multiple frequency band mobile telephones is expedited because calibration values found for one frequency band can readily be used (if the appropriate control voltage $U_{offset}$ is applied) for the remaining frequency bands as well. Consequently, the calibration time might be reduced by more than 50% for a triple band mobile telephone.

Figure 9:
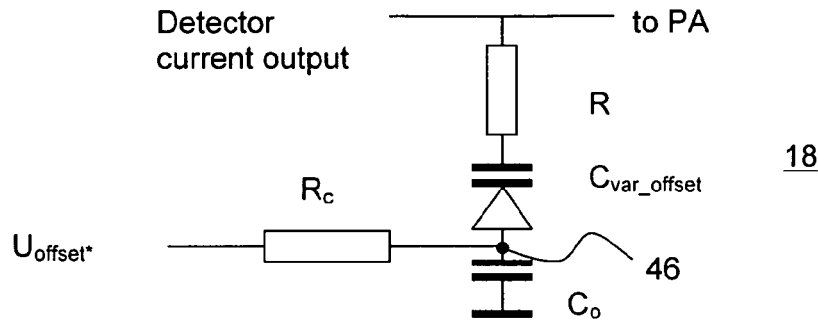
FIG. 9 schematically shows a third embodiment in accordance with the invention of a variable loop element in the form of a variable loop filter.

An additional resistor $R_c$ could be added, for example for filtering purposes, to the variable loop filter 18 as shown in FIG. 9. The resistor $R_c$ is coupled to the control terminal 46 and a modified control voltage $U_{offset*}$ has to be applied to the resistor $R_c$.

Figure 10:
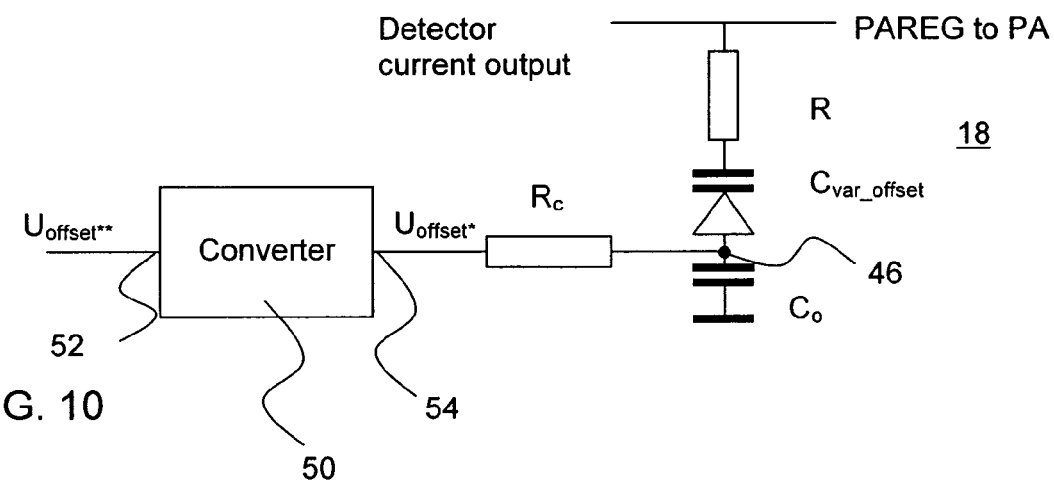
FIG. 10 schematically shows a fourth embodiment in accordance with the invention of a variable loop element in the form of a variable loop filter.

As depicted in FIG. 10, the control signal $U_{offset*}$ can be provided by a signal converter 50 which helps to better adapt the characteristic of $C_{var\_offset}$ of the varicap diode to the characteristic of the power amplifier constant $K_{pa}$. The signal converter 50 comprises a control terminal 52 for receiving a control signal $U_{offset}$ and an output terminal 54** coupled to the resistor $R_c$. In principle, the resistor $R_c$ depicted in FIG. 10 could be omitted and the output terminal 54 of the signal converter 50 could be directly coupled to the control input 46.

The signal converter 50 linearity or non-linearity transforms the control signal $U_{offset**}$ into the control signal $U_{offset*}$ in accordance with the relationship $U_{offset*}=f_{converter}(U_{offset**})$. The signal converter 50 may comprise a filter circuit, a multiplier, a level shifter, a buffer, a limiter, a look-up table or a voltage/current source.

Figure 11:
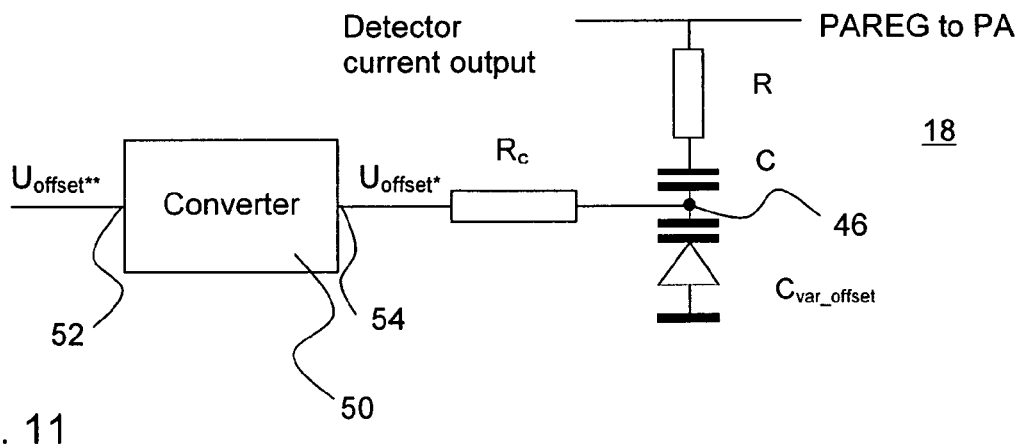
FIG. 11 schematically shows a fifth embodiment in accordance with the invention of a variable loop element in the form of a variable loop filter.

An alternative embodiment of the variable loop filter 18 with $C_{var\_offset}$ connected single sided to ground is depicted in FIG. 11.

Figure 12:
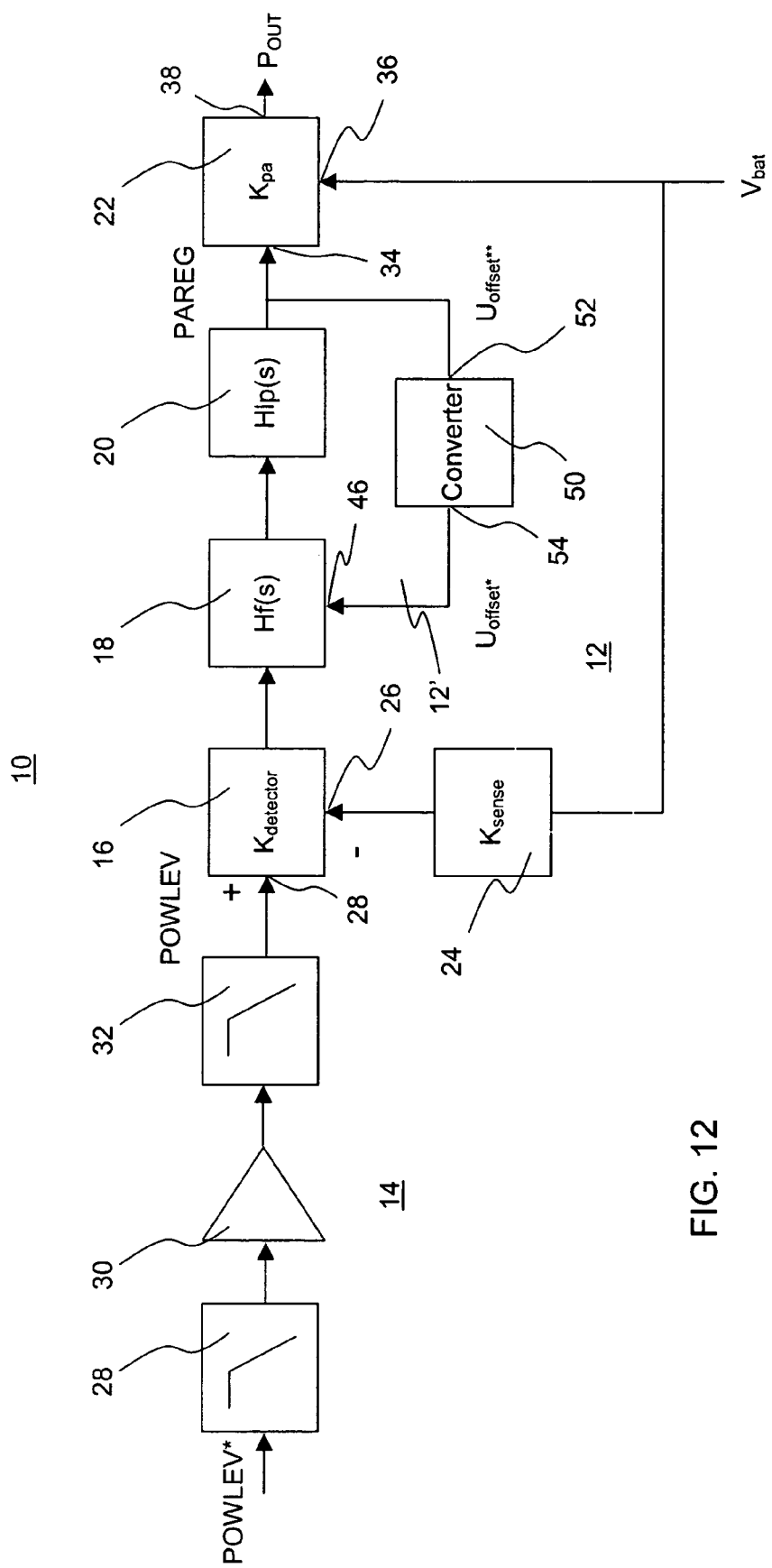
FIG. 12 shows a block diagram of an R.F. power amplifier circuit comprising the variable loop element depicted in FIG. 11 or 12.

In principle, the control input 46 of the variable loop filter 18 could be connected directly or indirectly to the power amplifier control voltage PAREG or another power control signal like the power amplifier reference voltages POWLEV or POWLEV*. In this regard FIG. 12 exemplarily shows the block diagram of the power control loop 12 with the control terminal 52 of the signal inverter 50 coupled to the PAREG signal to create an internal control loop 12'. It should be noted that the control input 46 of the variable loop filter 18, or of any other variable loop element (for example the current sensing element 24 or the detector 16), could alternatively be coupled to a node arranged between the pulse shaping filter 28 and the detector 16 or the detector 16 and the loop filter 18. Of course, $U_{offset}$, $U_{offset*}$ or $U_{offset**}$ could also be supplied directly from a digital control interface like an analog/digital converter.

Figure 13:
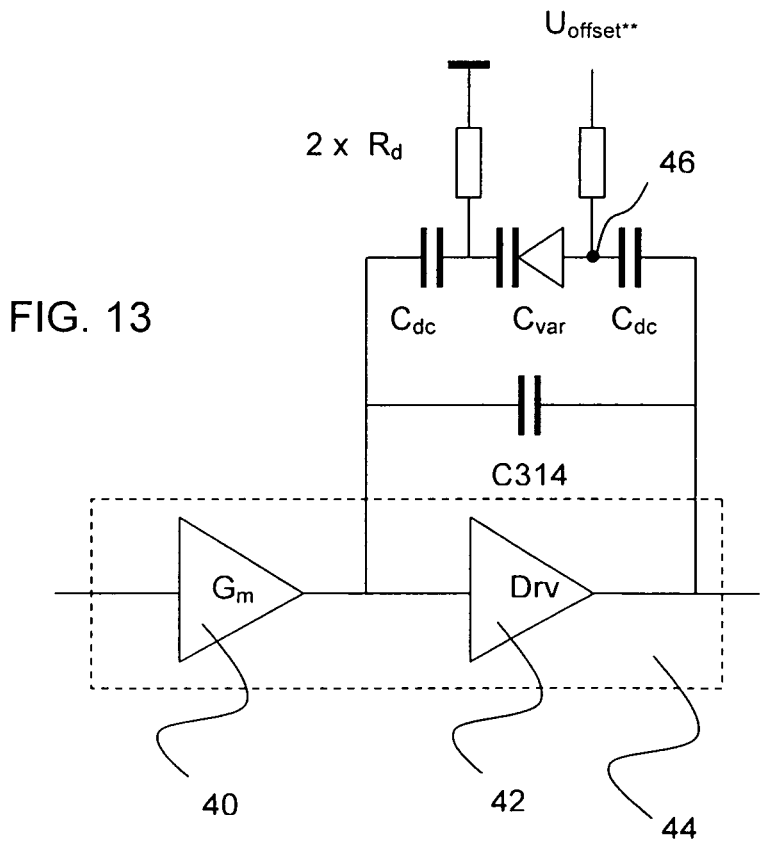
FIG. 13 shows a practical arrangement of a variable loop filter in a variable loop filter.

FIG. 13 shows a circuit with a variable loop filter used for practical measurements performed on a mobile telephone board. The circuit of FIG. 13 is based on the circuit of FIG. 4 with the static loop filter.

Figure 14:
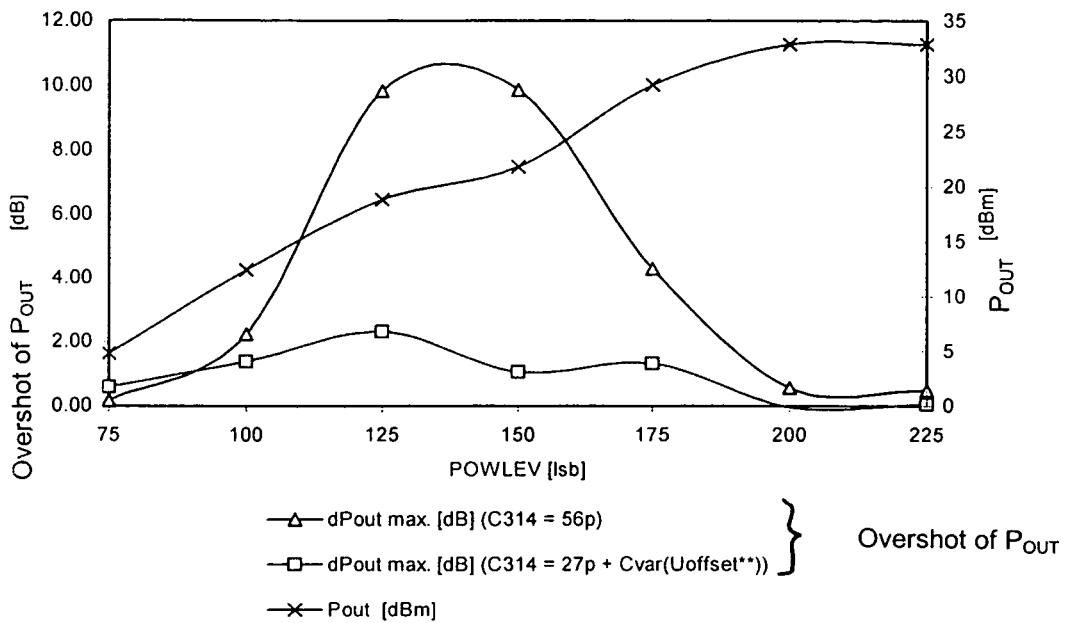
FIG. 14 shows the relationship between the power amplifier output power and the power amplifier control voltage for the arrangement depicted in FIG. 13.

Returning to FIG. 13, resistor $R_d$ is used to provide a dc path for the varicap diode $C_{var}$. Capacity $C_{dc}$ is used to provide dc decoupling for the signal $U_{offset}$. The signal $U_{offset}$ is supplied by an external, variable voltage source. The diagram of FIG. 14 shows the power amplifier output power versus power control voltage POWLEV as measured for the circuit of FIG. 13. From FIG. 14 it becomes apparent that the loop filter arrangement depicted in FIG. 13 helps to reduce the overshot in output power compared to the unmodified circuit depicted in FIG. 4.

Figure 15A:
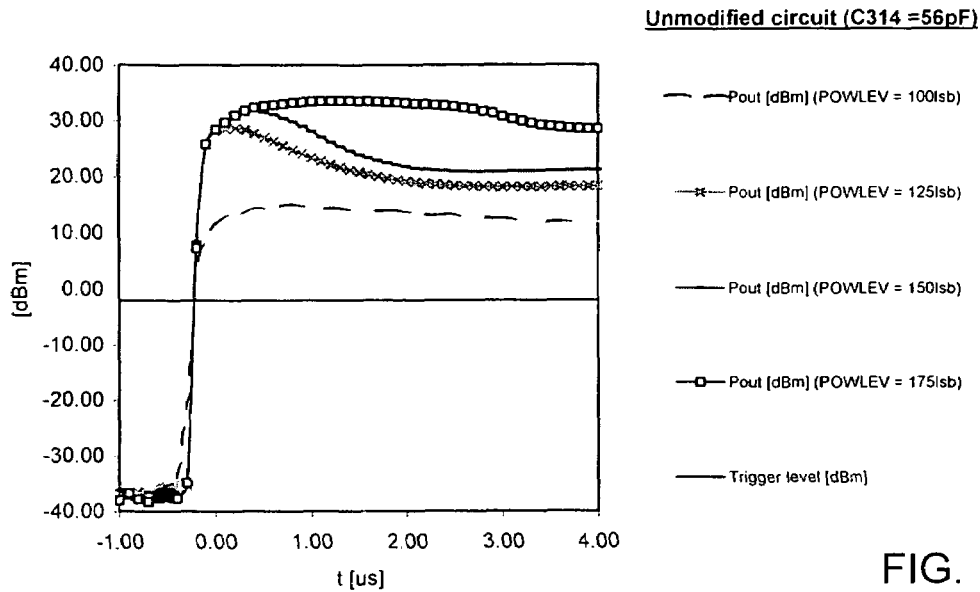
FIGS. 15a and 15b show the power amplifier output power as a function of time step response of a prior art power amplifier circuit and of a power amplifier circuit according to the invention.
Figure 15B:
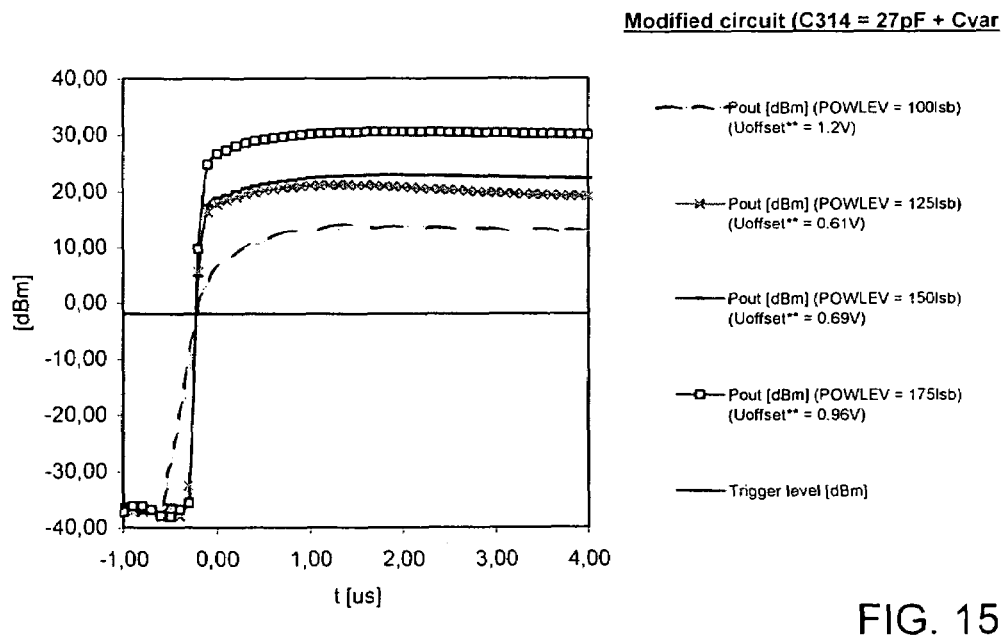

FIGS. 15a and 15b show the output power versus time step response of the unmodified and modified circuit depicted in FIGS. 4 and 13, respectively. It can be clearly seen that the maximum power overshot is reduced by about more than 75%.

The invention claimed is:

1. An R.F. power amplifier circuit comprising a power control loop with:
   an R.F. power amplifier having a power control input and a power supply input; and
   at least one variable loop element coupled between the power control input and the power supply input of the power amplifier, the at least one variable loop element having a control input configured to reduce variations of control loop parameters.

2. The power amplifier circuit of claim 1, wherein the control input of the variable loop element is coupled to the power control loop or to a signal supply branch of the power control loop to form an internal control loop which includes the variable loop element.

3. The power amplifier circuit of claim 1, wherein the variable loop element is a variable filter or a variable current sensing element.

4. The power amplifier circuit of claim 3, wherein the variable filter comprises at least one of a variable resistor and a variable capacitance.

5. The power amplifier circuit of claim 1, wherein the variable loop element comprises a varicap diode.

6. The power amplifier circuit of claim 1, wherein the variable loop element is a detector having variable characteristics.

7. The power amplifier circuit of claim 1, further comprising at least one of a digital control interface and a signal converter coupled to the control input of the variable loop element.

8. The power amplifier circuit of claim 7, wherein the signal converter is arranged within an internal control loop which also includes the variable loop element and which is formed by coupling the control input of the variable loop element to the power control loop or to a signal supply branch of the power control loop.

9. The power amplifier circuit of claim 7, wherein a control terminal of the signal converter is coupled to the digital control interface.

10. The power amplifier circuit of claim 7, wherein at least one of the signal converter and the digital control interface is arranged within an internal control loop which also includes the variable loop element and which is formed by coupling the control input of the variable loop element to the power control loop or to a signal supply branch of the power control loop.

11. A power control loop for an R.F. power amplifier circuit, the power control loop comprising:
   an R.F. power amplifier having a power control input and a power supply input; and
   a variable capacitance coupled between the power control input and the power supply input of the power amplifier, the variable capacitance having a control input for inputting a control signal for linearizing control loop parameters.

12. A power control loop of an R.F. power amplifier circuit, the power control loop comprising:
   an RF power amplifier having a power control input and a power supply input;
   at least one variable element arranged between the power control input and the power supply input of the power amplifier, the at least one variable element having a control input; and
   an internal control loop including the variable element, the internal control loop being formed by coupling the control input of the variable element to either one of the power control loop or a signal supply branch for the power control loop,
   wherein the control input of the variable element is configured to reduce variations of control loop parameters.

13. A method of controlling the output power of an R.F. power amplifier using a power control loop for taking into account a feedback signal characteristic of a current consumption of the power amplifier, comprising:
   providing at least one loop element with variable characteristics, the at least one loop element having a control input; and
   varying the characteristics of the loop element by applying a control signal to the control input of the variable loop element such that variations of control loop parameters are reduced.

14. The method of claim 13, wherein the characteristics of the loop element are varied to reduce variations of control loop parameters that result from variations of the power amplifier constant.

15. The method of claim 13, wherein a feedback signal tapped from the power control loop or from a signal supply branch of the power control loop is directly or after signal conversion fed to the control input of the loop element.

16. The method of claim 13, wherein the characteristics of the loop element are controlled by a power control signal for the power amplifier or a signal derived therefrom.

17. The method of claim 13, wherein the characteristics of the loop element are controlled by a dedicated control signal.

18. The method of claim 13, wherein the R.F. power amplifier is operable in multiple frequency bands and wherein the characteristics of the loop element are individually controlled in each frequency band.

19. A computer program product for controlling the output power of an R.F. power amplifier using a power control loop for taking into account a feed back signal characteristic of a current consumption of the power amplifier, wherein at least one loop element with variable characteristics and with a control input is provided, the computer program product comprising program code portions for varying the characteristics of the loop element such that variations of control loop parameters are reduced.

20. The computer program product of claim 19, stored on a computer readable recording medium.

* * * * *